(12) United States Patent
Shioda et al.

(10) Patent No.: US 6,569,789 B1
(45) Date of Patent: May 27, 2003

(54) CONDUCTIVE MATERIAL AND ITS MANUFACTURE THEREOF

(75) Inventors: Seiji Shioda, Fukui (JP); Akihide Katayama, Fukui (JP); Hiroo Kishimoto, Takefu (JP); Yoshiyuki Hirano, Fukui (JP)

(73) Assignee: Seiren Co., Ltd., Fukui (JP)

( * ) Notice: Subject to any disclaimer, the term of this patent is extended or adjusted under 35 U.S.C. 154(b) by 0 days.

(21) Appl. No.: 09/230,934

(22) PCT Filed: Mar. 31, 1997

(86) PCT No.: PCT/JP97/01110

§ 371 (c)(1),
(2), (4) Date: Feb. 3, 1999

(87) PCT Pub. No.: WO98/06247

PCT Pub. Date: Feb. 12, 1998

(30) Foreign Application Priority Data

Aug. 5, 1996 (JP) ............................................. 8-205545

(51) Int. Cl.⁷ ............................... B32B 5/18; B32B 5/24
(52) U.S. Cl. ....................... 442/221; 442/222; 442/229; 442/230; 442/231; 442/315; 442/316; 442/317; 442/370; 442/371; 442/376; 442/377; 442/379; 428/304.4; 428/308.4; 428/316.6
(58) Field of Search ................................. 442/221, 222, 442/315, 316, 317, 370, 371, 376, 377, 379, 229, 230, 231; 428/304.4, 308.4, 316.6

(56) References Cited

U.S. PATENT DOCUMENTS

| | | | | |
|---|---|---|---|---|
| 4,118,533 A | * | 10/1978 | Hipchen et al. | 442/371 |
| 4,569,880 A | * | 2/1986 | Nishiyama et al. | 428/212 |
| 4,857,668 A | * | 8/1989 | Buonanno | 174/35 GC |
| 4,960,633 A | * | 10/1990 | Hiza et al. | 428/215 |
| 5,198,286 A | * | 3/1993 | Kagoshima et al. | 428/246 |
| 5,604,026 A | * | 2/1997 | King | 428/317.1 |

FOREIGN PATENT DOCUMENTS

| | | | |
|---|---|---|---|
| CN | 1130223 | * | 9/1996 |
| JP | 61/219199 | | 9/1986 |
| JP | 61-219199 | * | 9/1986 |
| JP | 62/141799 | | 6/1987 |
| JP | 4/116197 | | 10/1992 |
| JP | 7/224942 | | 8/1995 |

\* cited by examiner

*Primary Examiner*—Terrel Morris
*Assistant Examiner*—John Guarriello
(74) *Attorney, Agent, or Firm*—Dilworth & Barrese, LLP

(57) ABSTRACT

A conductive material suitable as a gasket material for shielding the electromagnetic wave and a method of fabrication thereof are disclosed. The conductive material is intended to protect electronics equipment and devices from an erroneous operation which otherwise might be triggered by the electromagnetic wave leaking from other electronic equipment or devices and also to prevent a radio wave interference with communication equipment. A composite material sheet composed of a synthetic fiber-structured sheet and a porous synthetic resin sheet integrally bonded to each other is plated with a metal. In order to improve the working efficiency for final applications, an adhesive layer covered with the releasing paper is formed on one of the sheet surfaces.

30 Claims, 2 Drawing Sheets

CONDUCTIVE MATERIAL AND ITS MANUFACTURE THEREOF

FIELD OF THE INVENTION

The present invention relates to a conductive material suitable as a gasket material for shielding the electromagnetic wave leaking mainly from electric devices and equipment and a method of manufacture thereof.

DESCRIPTION OF THE RELATED ART

In recent years, electronics equipment including personal computers, television games, portable telephone, and the like have come to be widely used and the ownership thereof has extended into home applications. With the expansion of the use of these equipment from industrial fields to home applications, the problem that the electromagnetic wave leaking from these equipment may cause an operation error of other electronics equipment and radio wave interference for communication equipment has become an increasingly serious subject of discussion in mass media.

Under these circumstances, a demand is high in the electronics and related industries for an electromagnetic wave shielding material which exhibits an excellent masking effect for preventing various interferences of the electromagnetic waves leaking from such devices and equipment.

Generally, an especially serious problem of the electromagnetic wave generated from electronics devices and equipment derives from the electromagnetic wave leaking from the joints of the parts constituting a housing of the equipment and from the gaps between the doors mounted on the housing. Various forms of gaskets have so far been proposed for shielding the electromagnetic wave leaking therefrom.

A practical effect has been achieved to some degree by a gasket product having a compression resistance and a metal-like conductivity as a shielding material exhibiting a sufficient shielding capacity. Such a product, as shown in FIG. 1, is made of a foamed polyurethane material making up a rectangular parallelopipedal porous synthetic resin sheet 1 not plated with metal but adhesively wound with a metal-plated fiber cloth 2, and an adhesive layer 3 is formed on the whole or part surface of the fiber cloth, after which the releasing paper 4 is laid thereon. The foamed urethane material actually used, however, because of its high flexibility and cushion property, is materially so weak that the work of cutting the material into a thin strip with a specified width in a predetermined direction is considerably difficult from the technical standpoint. Such being the situation, a compression-molded foamed material is actually used which is permanently deformed by being thermally compressed to the desired thickness in order to attach a compression resistance.

Such a gasket material is manufatured by a method in which a parallelopipedal foamed polyurethane material mechanically slited in advance is wound with a metal plated fiber cloth having an adhesive. This manufacturing process requires considerable labor, resulting in an increased production cost.

OBJECT OF THE INVENTION

The present invention has been developed in view of this present situation, and the object of the invention is to provide a conductive material and a method of fabrication thereof, which eliminates complicated steps required for fabricating conventional electromagnetic shield gasket materials and which can mass-produce a gasket material low in cost, uniform in quality and high in reliability.

SUMMARY OF THE INVENTION

The present inventors have developed this invention as a result of an intensive study to achieve the above-mentioned objects.

According to one aspect of the invention, there is provided a conductive material suitable as an electromagnetic shield gasket material in which an organic fiber-structured sheet and a porous synthetic resin sheet are integrally laid one on the other into a composite sheet and metallized.

According to a second aspect of the invention, there is provided a method of fabricating a conductive material suitable as an electromagnetic shield gasket, in which an organic fiber-structured sheet and a porous synthetic resin sheet are bonded one on the other, and the resulting composite sheet is plated with a metal.

Figure 9:
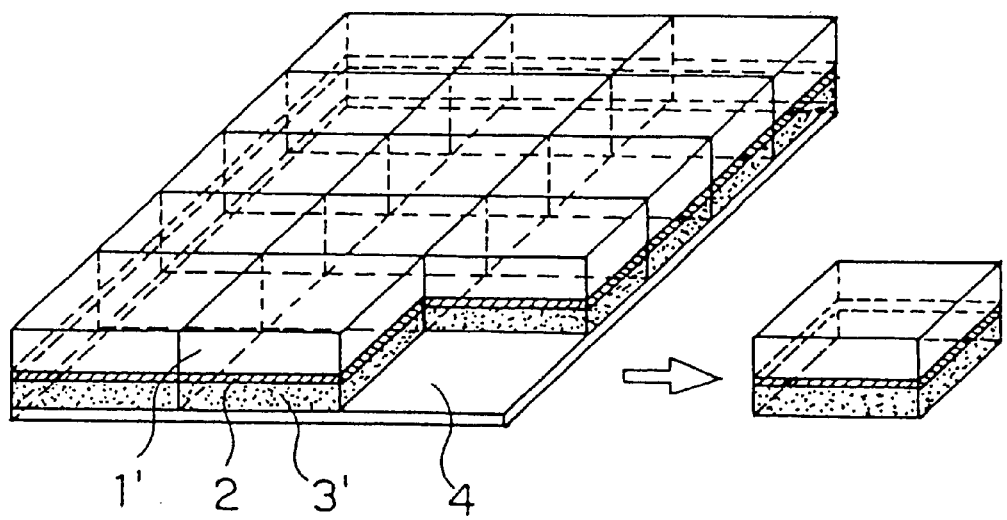
FIG. 9 is a perspective view schematically showing a partially-cut composite material sheet with the releasing paper (or film) arranged on the conductive adhesive layer in FIG. 8.
Figure 10:
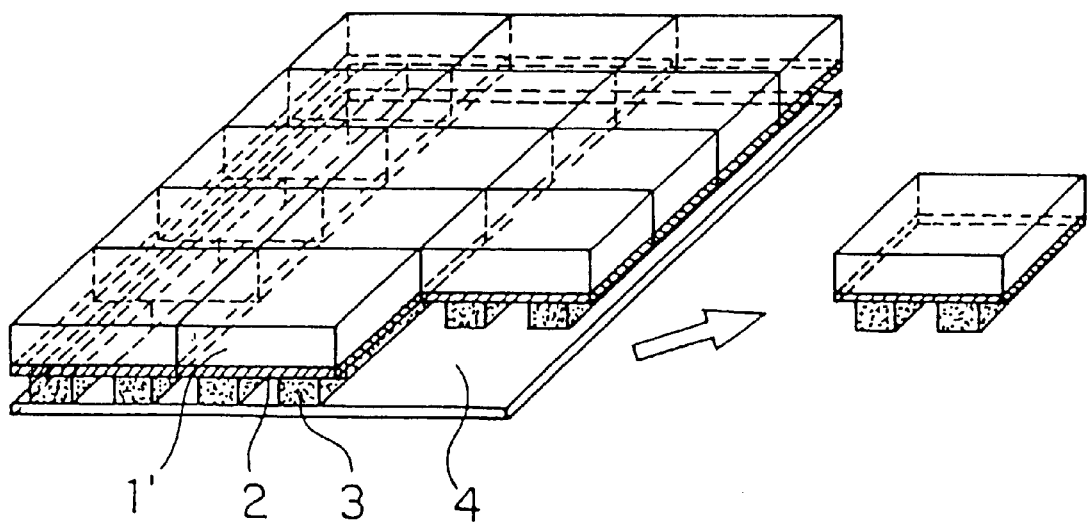
FIG. 10 is a perspective view schematically showing a partially-cut composite material sheet with the releasing paper arranged on the adhesive layer formed partially in FIG. 6.

The perspective views of FIGS. 9 and 10, which are for explaining the partially-cut state, show the structural parts in simplified fashion and are thus different from the remaining diagrams.

In the figures, reference numeral 1 designates a porous synthetic resin sheet not plated with a metal, numeral 1' a porous synthetic resin sheet plated with a metal, numeral 2 a fiber cloth plated with a metal, numeral 3 an adhesive layer, numeral 3' a conductive adhesive layer, numeral 4 a releasing paper, numeral 5 an organic fiber-structured sheet plated with a metal, and numeral 6 a bonded portion.

DESCRIPTION OF THE PREFERRED EMBODIMENTS

Figure 4:
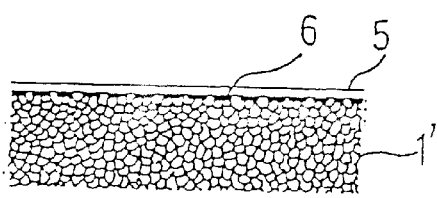
FIG. 4 is a sectional view schematically showing a composite material sheet composed of an organic fiber-structured sheet and a porous synthetic resin sheet according to the invention.

A typical example of a conductive material suitable as an electromagnetic shield gasket material according to the present invention has a sectional structure as shown in FIG. 4. Further, as shown in FIGS. 5 to 8, an adhesive layer 3 covered with the releasing paper 4 is formed on the whole or part of the outer surface of a metallized composite material sheet thereby to form a conductive material suitable as an electromagnetic wave shield gasket material. Also, a composite material sheet produced by laminating an organic fiber-structured sheet and a porous synthetic resin sheet on one another in advance is plated with a metal, and the whole or part of the composite material sheet thus obtained is coated with an adhesive and then covered with the releasing paper thereby to form a conductive material suitable as an electromagnetic wave shield gasket.

Figure 2:
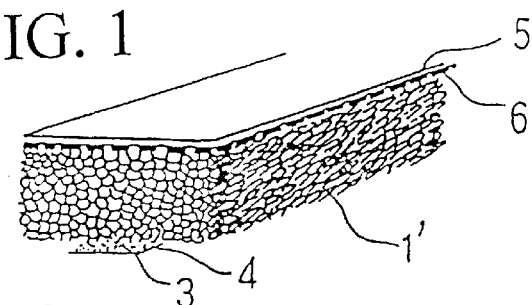
FIG. 2 is a perspective view schematically showing an electromagnetic wave shield gasket material comprising a composite material composed of an organic fiber-structured sheet and a porous synthetic resin sheet and an adhesive layer formed on the porous sheet surface according to the invention.
Figure 3:
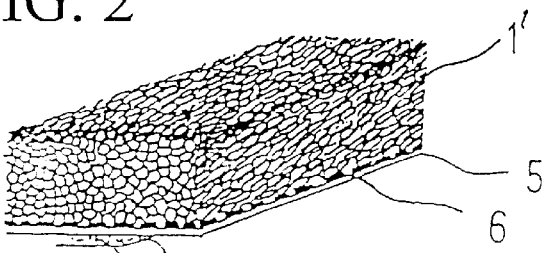
FIG. 3 is a perspective view schematically showing an electromagnetic wave shield gasket material comprising a composite material composed of an organic fiber-structured sheet and a porous synthetic resin sheet and an adhesive layer formed on the surface of the organic fiber-structured sheet according to the invention.
Figure 5:
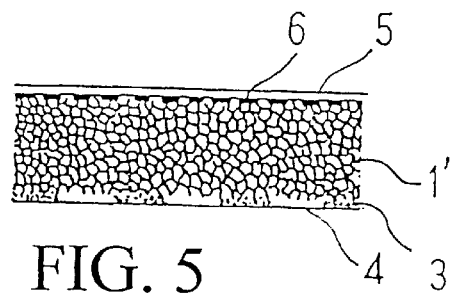
FIG. 5 is a sectional view schematically showing an electromagnetic shield gasket material composed of the composite material sheet of FIG. 4 according to the invention wherein the porous synthetic resin surface thereof is partially coated with an adhesive.
Figure 6:
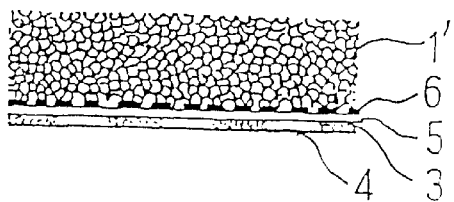
FIG. 6 is a sectional view schematically showing an electromagnetic shield gasket material composed of the composite material sheet of FIG. 4 according to the invention wherein the organic fiber-structured sheet surface thereof is partially coated with an adhesive.

FIG. 2 is a perspective view showing an electromagnetic wave shield gasket material representing an example form cut out from the shield gasket material of FIG. 5 in a specified size, and FIG. 3 is a perspective view showing an electromagnetic wave shield gasket material representing an example form cut out similarly from the shield gasket material shown in FIG. 6.

The fiber-structured sheets used in the invention include woven, knit, and nonwoven fabric and the like fiber cloth. The fibers making up these materials include an organic fiber, i.e., a chemical fiber such as synthetic fiber, semi-synthetic fiber and regenerated fiber or natural fiber such as vegetable fiber and animal fiber. In spite of this, polyamide fiber, polyester fiber, acrylic fiber or the like synthetic fiber is more preferable, of which polyester (polyethylene terephthalate) fiber is most preferable. These fibers preferably are a multi-filament having a single fiber of 0.1 to 5 denier. Also, nonwoven fiber is more preferable as a type of fiber cloth. The weight of the fiber cloth is preferably about 10 to 100 g/m$^2$.

In order to securely deposit the metal to these fiber-structured sheets, the sizing agent, oil, dust or other impurities attached on the surface of the fiber sheet are preferably completely removed by a scouring process.

A preferable porous synthetic resin sheet used in the invention is a soft foamed sheet of three-dimensional network structure having open cells and also, having good compression stability and containing substantially no cell film. Examples of the porous sheet having these properties include foamed polyethylene, foamed polypropylene, foamed polyvinyl chloride, foamed polyurethane, foamed polyimide and foamed polybutadiene. Polyester- or polyether based foamed polyurethane is especially preferable.

These foamed sheets are available in various types including soft property semi-hard property, hard property and cell density. The cell density is not preferaly high for securing uniform metal plating within the foam. Taking the function of the final applications into account, the optimum density should be selected. Generally speaking, a preferable cell density is about 20 to 100 units/inch.

The thickness of the porous synthetic resin sheet, though different according to applications, is usually about 0.5 to 5 mm.

In one method of producing a composite material of an organic fiber-structured sheet and a porous synthetic resin sheet, an adhesive is coated on an arbitrary surface of one of the sheets and bonding the other sheet laid on the first sheet. In another method a part of the surface of the porous sheet is heat-melted and immediately the fiber-structured sheet laid and bonded thereon. The letter method using melt-bonding is recommended, however, in order to secure a sufficient conductivity of the bonded portion between the organic fiber-structured sheet and the porous synthetic resin sheet when the composite material is plated with a metal. The melt-bonding can be accomplished by melting the surface of a foamed urethane sheet directly with a gas flame and then overlaying it on the surface of a fiber cloth sheet as a composite material. In the process, the melting of the foamed sheet with a fire flame preferably reaches the depth of about 0.3 to 1 mm from the surface. The melting depth of not more than 0.3 mm would produce no sufficient bonding strength, while the melting depth of 1 mm or more would lead to an increased fabrication cost. Also, the composite material can be plated with a metal not only in the interior of the organic fiber-structured sheet and the porous synthetic resin sheet but also in the interior of the melted layer portion of the foamed material to attain a satisfactory conductivity at the bonded portion between the organic fiber-structured sheet and the porous synthetic resin sheet.

The composite material can be metallized in such a manner that after a preliminary process of attaching and activation of a catalyst as in normal plating, the desired metal such as Ag, Ni, Cu, Au or Cu followed by Ni is subjected to electroless plating and/or electroplating.

The thickness of the metal plating film formed on the composite material is preferably 0.01 to 2 μm.

A given surface of the composite material sheet plated in the above-mentioned manner can be given an adhesive property in order to facilitate the use thereof as an electromagnetic shield gasket material. In such a case, the adhesive used can be the one of an ordinary synthetic resin. Examples of the preferable adhesives include natural rubber, synthetic rubber or the like rubber adhesive, acrylic ester copolymer or the like acrylic adhesive, silicone rubber/resin or the like silicone adhesive or vinyl ether polymer or the like vinyl adhesive. A more preferable adhesive is an acrylic one. An adhesive having a conductivity is even more preferable. The adhesive can be coated on the sheet partially in dots by the gravure coater or in stripes by the printer, or over the entire surface of the sheet. From the sheet coated with such an adhesive the solvent contained in the adhesive is evaporated by being dried and then the release paper is laid on the surface of the adhesive layer. Alternatively, the adhesive is coated first on the release paper, and then the sheet can be laid on it in the same process as mentioned above.

Figure 7:
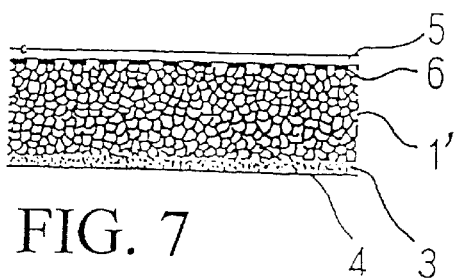
FIG. 7 is a sectional view schematically showing an electromagnetic shield gasket material composed of the composite material sheet of FIG. 4 according to the invention wherein the whole surface of the porous synthetic resin material thereof is coated with a conductive adhesive.
Figure 8:
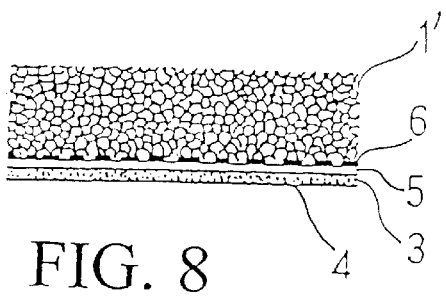
FIG. 8 is a sectional view schematically showing an electromagnetic shield gasket material composed of the composite material sheet of FIG. 4 according to the invention wherein the whole surface of the organic fiber-structured material is coated with a conductive adhesive.

Especially, the material with a conductive adhesive coated on the entire surface thereof as shown in FIGS. 7 to 9, even when a part thereof is cut out and used, can produce a uniform adherence and a sufficient conductivity with an object adhered, and thus provides a reliable product. Such a gasket material is easy to coat in spit e of its high fabrication cost. The range of fields in which this material finds applications is further widened especially in the case where it is formed in an arbitrarily thin strip to suit the final use thereof as an electromagnetic wave shield gasket material.

EFFECT OF THE INVENTION

The conductive material, or especially the electromagnetic wave shield gasket material according to this invention can be manufactured easily with low cost and with stable quality. This material exhibits the same performance in spite of the fact that the manual labor is eliminated of coating an adhesive on a metallized cloth and winding it around a preformed rectangular parallelopipedal foamed polyurethane. Also, the conventional metal-plated foamed polyurethane cannot be sufficiently slitted because of an extremely low tensile strength along the length thereof. The fabrication method according to the present invention, in contrast, has no problem of the tension acting along the length in the process of plating or coating the adhesive, thereby facilitating the processing operation.

Further even after the product is slitted into the form of thin tape, a sufficient lengthwise strength is maintained and thereby the continuous processing is made possible in all the steps of productions.

EXAMPLES

Now, the present invention will be explained with reference to examples.

Measurement methods used are as follows:

1. Compression Strain (%)

After the thickness of a square test piece 100 mm long on each side is measured, the test piece is compressed and fixed to 50% of the thickness with an aluminum compression plate having parallel surfaces. The test piece is then heated for 22 hours in a constant-temperature bath of 70+5° C., after which the test piece is released from the compression plate and allowed to stand for 30 minutes at room temperature. Then, the thickness of the test piece is measured. The compression strain (%) is calculated according to the equation below.

$$c=(t_0-t_1)/t_0-100$$

where C is the compression strain (%), $t_0$ is the initial thickness of the test piece, and $t_1$ is the thickness of the test piece after test.

2. Electric Resistance (Ω)

Along the thickness: Two test pieces each 10 mm wide and 60 mm long are sandwitched between two copper plates of 100 cm² (10 cm×10 cm) and then compressed by 50% and the resistance between the copper plates is measured.

Along the length: A test piece 10 mm wide and 60 mm long is held at the two ends thereof by electrodes, and the resistance of the test piece:portion 40 mm long is measured.

3. Shielding Property (dB)

Two copper plates each 1 mm thick (of 200 mm×200 mm) each with a central rectangular hole of 5×25 mm are provided, a test piece is mounted between the holes, and the shield property was measured by KEC (Kansai Electronic industry development Center) method. The test piece is mounted between the transmission and receiving antennas in a shield box, the strength of the electric field received is measured, and the shield property (dB) is determined from the ratio of the measured strength of the electric field to the strength of the electric field in the absence and in the presence of the test piece.

(Shield property)=20 log[electric field strength in the absence of shield material/electric field strength in the presence of shield material] (dB)

4. Tensile Strength (kg/inch)

A test piece one inch wide and 30 cm long is held and the tensile strength thereof is measured in a tensile tester at the tensioning rate of 30 cm/min with a 20 cm interval, and the point of breakage was determined as the limit.

Example 1

A spun bonded nonwoven cloth (40 g/m² in weight) composed of polyester long fiber (single thread denier of 2.0 d) was bonded with a foamed polyurethane sheet 1.6 mm thick having a cell density of 40 per inch by melt-bonding to produce a composite material 1.3 mm thick.

After the composite material is sufficiently cleaned, it was immersed for two minutes in a 40° C. aqueous solution containing 0.3 g/L palladium chloride, 30 g/L stannous chloride and 300 ml/L 36% hydrochloric acid, and washed in water. The resulting material was immersed in 10% sulfuric acid for five minutes at 30° C., and washed in water.

Further, the material was immersed for 5 minutes in 30° C. electroless copper plating solution composed of 7.5 g/L copper sulfate, 30 ml/L 37% formalin and 85 g/L Rochelle salt, and washed in water. The resulting material was immersed for 10 minutes in a 35° C. electroless nickel solution contaning 30 g/L nickel sulfate, 20 g/L sodium hypophosphite and 50 g/L ammonium citrate, and washed in water, thus producing a composite material with a uniformly-plated surface of the fiber and the foamed material cell.

The performance of this composite material is superior in strength, electromagnetic wave shield property and conductivity, as shown in Table 1.

Example 2

A nonwoven cloth (50 g/m² in weight) composed of rayon long fiber (single thread denier of 2.0 d) was bonded with a foamed polyurethane sheet 1.6 mm thick having a cell density of 40 per inch by melt-bonding to produce a composite material 1.3 mm thick.

The test piece was subjected to the process similar to the one in Example 1 to produce a composite material with a uniformly-plated fiber surface and internal surface of the foam cell.

This material, as shown in Table 1, is superior in strength, electromagnetic wave shield property and conductivity.

Example 3

A spun bonded nonwoven cloth (40 g/m² in weight) composed of polyester long fiber (single thread denier of 2.0 d) was bonded with a foamed polyurethane sheet 3.5 mm thick having a cell density of 50 per inch by melt-bonding to produce a composite material 3.0 mm thick.

The test piece was subjected to the process similar to the one in Example 1 to produce a composite material with a uniformly-plated fiber surface and internal surface of the foam cell.

This material, as shown in Table 1, is superior in strength, electromagnetic wave shield property and conductivity.

Example 4

A spun bonded nonwoven cloth (40 g/m² in weight) composed of polyester long fiber (single thread denier of 2.0 d) was bonded with a foamed polyurethane sheet 1.6 mm thick having a cell density of 40 per inch by melt-bonding to produce a composite material 1.3 mm thick.

This composite material, after being sufficiently cleaned, was immersed for two minutes in a 40° C. aqueous solution containing 0.3 g/L palladium chloride, 30 g/L stannous chloride and 300 ml/L 36% hydrochloric acid, and washed in water. The resulting material was immersed in 10% sulfuric acid for five minutes at 30° C., and washed in water again.

Further, the resulting material was immersed for 10 minutes in a 35° C. electroless nickel solution containing 30 g/L nickel sulfate, 20 g/L sodium hypophosphite and 50 g/L ammonium citrate, and washed in water. As a result, a composite material was produced in which the surface of the fiber and the internal surface of the foam cell are plated uniformly.

The performance of this composite material is superior in strength, electromagnetic wave shield property and conductivity, as shown in Table 1.

Example 5

A woven fabric (with warp and weft of 50 d/48 f, 60 g/m$^2$ in weight) composed of polyester long fiber (single thread denier of 1.0 d) was bonded with a foamed polyurethane sheet 1.6 mm thick and having a cell density of 40 per inch by melt-bonding to produce a composite material 1.4 mm thick.

The test piece was subjected to the process similar to the one according to Example 1 to produce a composite material with the surface of the fiber and the internal surface of the foam cell uniformly plated.

This material, as shown in Table 1, is superior in strength, electromagnetic wave shield property and conductivity.

Example 6

A silicon release paper (64 GS made by Honshu Paper) was coated in dots with an acrylic adhesive (XA-3732 made by Toa Paint) with a viscosity of 5500 CPS using a gravure coater, and was dried. The resulting material was pressure-bonded integrally with the composite material produced in Example 1. The performance was evaluated in the same manner as in the Example 1. The result is shown in Table 1.

Example 7

A double raschel knit material (135 g/m$^2$ in weight) composed of polyester long fiber (30 d/24 f) was bonded with a foamed polyurethane sheet 1.6 mm thick and having a cell density of 40 per inch by melt-bonding to produce a composite material 1.6 mm thick.

The test piece was subjected to the process similar to the one according to Example 1 to produce a composite material with the surface of the fiber and the internal surface of the foam cell uniformly plated.

This material, as shown in Table 1, is superior in strength, electromagnetic wave shield property and conductivity.

Example 8

A plane weave fabric composed of a cotton of 36 counts thread for both warp and weft (having a density of 15 threads per inch and 76 threads per inch, respectively) was bonded with a foamed polyurethane sheet 1.8 mm thick and having a cell density of 40 per inch by melt-bonding to produce a composite material 1.4 mm thick.

The test piece was subjected to the process similar to the one according to Example 1 to produce a composite material with the surface of the fiber and the internal surface of the foam cell uniformly plated.

This material, as shown in Table 1, is superior in strength, electromagnetic wave shield property and conductivity.

Comparative Example 1

A woven fabric (having warp and weft of 50 d/48 f, 60 g/m$^2$ in weight) composed of polyester long fiber (single thread denier of 1.0 d) was sufficiently cleaned, and immersed for two minutes in a 40° C. aqueous solution containing 0.3 g/L palladium chloride, 30 g/L stannous chloride and 300 ml/L 36% hydrochloric acid, and washed in water. The resulting material was immersed in 10% sulfuric acid for five minutes at 30° C., and washed in water again.

Further, the material was immersed for 5 minutes in 30° C. electroless copper plating solution composed of 7.5 g/L copper sulfate, 30 ml/L 37% formalin and 85 g/L Rochelle salt, and washed in water. The resulting material was immersed for 10 minutes in a 35° C. electroless nickel solution contaning 30 g/L nickel sulfate, 20 g/L sodium hypophosphite and 50 g/L ammonium citrate, and washed in water. A fiber sheet was obtained in which the surface of the fiber was plated uniformly.

Figure 1:
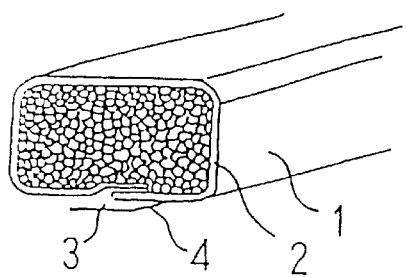
FIG. 1 is a perspective view schematically showing a conventional electromagnetic wave shield gasket material.

A rectangular parallelopipedal foamed polyurethane 10 mm wide and 1.5 mm high was wound and bonded integrally with the plated fiber sheet obtained in the above-mentioned manner to produce an electromagnetic wave shield gasket material shown in FIG. 1. The performance of this material was measured similarly.

Comparative Example 2

The same fiber as in the comparative example 1 was sufficiently cleaned, and immersed for two minutes in a 40° C. aqueous solution containing 0.3 g/L palladium chloride, 30 g/L stannous chloride and 300 ml/L 36% hydrochloric acid. The resulting material was immersed in 10% sulfuric acid for five minutes at 30° C., and washed in water.

The material thus obtained was immersed for 10 minutes in a 35° C. electroless nickel solution contaning 30 g/L nickel sulfate, 20 g/L sodium hypophosphite and 50 g/L ammonium citrate, and washed in water. A fiber sheet was obtained with the surface thereof plated uniformly.

A rectangular parallelopipedal foamed urethane 10 mm wide and 1.5 mm high was wound and bonded integrally with the plated fiber sheet obtained in the above-mentioned manner to produce an electromagnetic wave shield gasket material as shown in FIG. 1. The performance of this material was measured similarly.

Comparative Example 3

A foamed polyurethane sheet 1.6 mm thick and having a cell density of 40 per inch was sufficiently cleaned, and immersed for two minutes in a 40° C. aqueous solution containing 0.3 g/L palladium chloride, 30 g/L stannous chloride and 300 ml/L 36% hydrochloric acid, and washed in water. The resulting material was immersed in 10% sulfuric acid for five minutes at 30° C., and washed in water again.

The material was further immersed for 10 minutes in a 35° C. electroless nickel solution contaning 30 g/L nickel sulfate, 20 g/L sodium hypophosphite and 50 g/L ammonium citrate, and washed in water. Then, the surface of the polyurethane was plated.

The result of evaluation of this material is shown in Table 1.

|  | Compression strain (%) | Tensile strength (kg/in.) | Electric resistance (Ω) | | Shield property (dB) | | | |
|---|---|---|---|---|---|---|---|---|
|  |  |  | Along thickness | Along length | 50 MHZ | 100 MHZ | 500 MHZ | 1000 MHZ |
| Example 1 | 20 | 10 or more | 0.1 | 0.2 | 98 | 99 | 96 | 86 |
| Example 2 | 20 | 10 or more | 0.1 | 0.2 | 97 | 98 | 97 | 85 |
| Example 3 | 20 | 10 or more | 0.1 | 0.2 | 99 | 99 | 97 | 87 |
| Example 4 | 20 | 10 or more | 0.8 | 1.0 | 50 | 47 | 30 | 30 |
| Example 5 | 20 | 10 or more | 0.1 | 0.2 | 98 | 98 | 96 | 85 |
| Example 6 | 20 | 10 or more | 0.1 | 0.2 | 97 | 99 | 97 | 84 |
| Example 7 | 20 | 10 or more | 0.1 | 0.2 | 98 | 98 | 96 | 85 |
| Example 8 | 20 | 10 or more | 0.1 | 0.2 | 98 | 98 | 96 | 86 |
| Comparative Example | 18 |  | 0.1 | 0.2 | 99 | 98 | 97 | 87 |
| Comparative Example 2 | 19 |  | 0.7 | 1.0 | 46 | 36 | 27 | 25 |
| Comparative Example 3 | 20 | 1 | 0.1 | 0.2 | 97 | 98 | 96 | 85 |
| * | — | — | — | — | 20 | 25 | 23 | 25 |

* Foamed polyurethane only

What is claimed is:

1. A flexible conductive material for shielding an electromagnetic wave, the conductive material comprising a composite material composed of at least one organic fiber cloth sheet bonded to a synthetic resin open cell foam sheet, wherein the organic fiber cloth sheet and the synthetic resin foam sheet of the composite material are both simultaneously metallized by a metal plating process after the organic fiber cloth sheet and synthetic resin foam sheet are bonded together.

2. The conductive material of claim 1 wherein the organic fiber cloth sheet is selected from the group consisting of nonwoven fabrics, woven fabrics, and knit fabrics.

3. The conductive material of claim 1 wherein the organic fiber is a synthetic fiber.

4. The conductive material of claim 3 wherein the synthetic fiber is a polyester fiber.

5. The conductive material of claim 3 wherein the synthetic fiber cloth sheet and the synthetic resin foam sheet are melt bonded to each other.

6. The conductive material of claim 1 wherein the organic fiber is a multi-filament fiber.

7. The conductive material of claim 1 wherein the synthetic resin is a polyurethane.

8. The conductive material of claim 1 wherein the fiber cloth possesses a cloth internal space defined by fiber surfaces and the synthetic resin foam sheet possesses a foam internal space defined by cell walls, wherein the fiber surfaces and cell walls are metallized, and wherein the composite material is permeable and open to the flow of gas therethrough.

9. The conductive material of claim 1 wherein the metallized composite material has a metal coating between 0.02–2 μm in thickness.

10. The conductive material of claim 1 wherein the plating process is at least one process selected from the group consisting of electroless plating processes and electroplating processes.

11. The conductive material of claim 1 wherein the composite material is metallized with at least one metal selected from the group consisting of silver, nickel, copper, and gold.

12. The conductive material of claim 1 further comprising a releasing paper bonded by an adhesive to a surface of the metallized composite material.

13. The conductive material of claim 12 wherein the adhesive is a conductive adhesive.

14. The conductive material of claim 12 wherein at least the metallized composite material is cut into a plurality of mutually divisible small sections each having a predetermined area.

15. The conductive material of claim 11 wherein the surface is partially coated with adhesive.

16. The conductive material of claim 1 wherein said conductive material is a gasket.

17. The conductive material of claim 1 wherein said flexible conductive material is a gasket for an electronic device.

18. The conductive material of claim 1 wherein the organic fiber cloth sheet comprises polyester multifilament fibers and the synthetic resin comprises polyurethane.

19. A conductive composite comprising:
 a permeable cloth sheet formed from fibers;
 a synthetic resin open cell foam sheet;
 the cloth sheet and synthetic resin foam sheet overlapping to define an overlapping region;
 the cloth sheet being bonded to the synthetic resin foam sheet in the overlapping region to form a composite structure;
 a metallic coating deposited directly onto the composite structure coating at least a portion of the fibers of the cloth sheet in a manner that maintains the permeability of the cloth sheet and at least a portion of the synthetic resin foam sheet, the metallic coating being deposited by a metal plating process.

20. The conductive composite of claim 19 wherein the permeable cloth sheet comprises polyester multifilament fibers and the synthetic resin comprises polyurethane.

21. A method of fabricating a conductive material sheet for shielding an electromagnetic wave, the method comprising:
   bonding an organic fiber cloth sheet to a synthetic resin foam sheet to provide a composite material sheet, and
   plating the composite material sheet with a metal.

22. The method of claim 21 wherein the step of bonding further comprises the step of heat-melting a part of a surface of the synthetic resin foam sheet.

23. The method of claim 21 wherein the plated composite material sheet has a first surface and the method further comprises the steps of:
   providing a releasing paper having a second surface;
   coating an adhesive on one or the other of the first surface or the second surface; and,
   contacting the coated surface with the non-coated surface to provide a conductive material sheet with releasing paper thereon.

24. The method of claim 23 further comprising the step of cutting a portion of the plated composite material sheet into a plurality of mutually divisible small sections each having a predetermined area without cutting the releasing paper.

25. The method of claim 21 wherein the organic fiber cloth sheet comprises polyester fibers.

26. The method of claim 21 wherein the organic fiber cloth sheet comprises multifilament fibers.

27. The method of claim 21 wherein the synthetic resin comprises polyurethane.

28. The method of claim 21 wherein the synthetic resin foam sheet has first and second opposite surfaces and the step of bonding an organic fiber cloth sheet to the synthetic resin foam sheet comprises bonding the organic fiber cloth sheet to one of said first and second opposite surfaces.

29. The method of claim 21 wherein the synthetic resin foam sheet has first and second opposite surfaces and the step of bonding an organic fiber cloth sheet to the synthetic resin foam sheet comprises bonding the organic fiber cloth sheet to both of said first and second surfaces of the synthetic resin foam sheet.

30. The method of claim 21 wherein the organic fiber cloth sheet comprises polyester multifilament fibers and the synthetic resin comprises polyurethane.

* * * * *